United States Patent [19]
Kubota et al.

[11] Patent Number: 6,091,384
[45] Date of Patent: Jul. 18, 2000

[54] ELECTROLUMINESCENT DISPLAY PANEL

[75] Inventors: Yoshihisa Kubota; Satoshi Sugiura, both of Saitama-ken, Japan

[73] Assignee: Pioneer Electronic Corporation, Tokyo, Japan

[21] Appl. No.: 08/998,893

[22] Filed: Dec. 29, 1997

[30] Foreign Application Priority Data

Dec. 27, 1996 [JP] Japan ................................. 8-358890

[51] Int. Cl.[7] ........................................................ G09G 3/30
[52] U.S. Cl. ............................ 345/76; 345/81; 313/113; 313/114
[58] Field of Search .......................... 345/36, 45, 66, 345/74, 77, 76, 81; 313/169.3, 483, 484, 495, 500, 501, 505, 506, 509, 643, 113, 114; 340/825.81; 341/137

[56] References Cited

U.S. PATENT DOCUMENTS

| | | | |
|---|---|---|---|
| 4,774,435 | 9/1988 | Levinson | 313/509 |
| 5,072,152 | 12/1991 | Tuenge et al. | 313/509 |
| 5,095,245 | 3/1992 | Waymouth | 313/509 |
| 5,131,065 | 7/1992 | Briggs et al. | 385/120 |
| 5,206,746 | 4/1993 | Ooi et al. | 359/40 |
| 5,231,387 | 7/1993 | Clerc | 345/76 |
| 5,557,159 | 9/1996 | Taylor et al. | 313/336 |
| 5,672,938 | 9/1997 | Jones | 313/504 |
| 5,739,642 | 4/1998 | Peng et al. | 315/169.3 |
| 5,910,706 | 6/1999 | Stevens et al. | 313/498 |

*Primary Examiner*—Richard A. Hjerpe
*Assistant Examiner*—Henry N. Tran
*Attorney, Agent, or Firm*—Arent Fox Kintner Plotkin & Kahn

[57] ABSTRACT

A thin layer having a plurality of pixels is secured to a surface of a transparent substrate. A light emitting layer is formed in each of the pixels of the thin layer. A direction changing devices is provided for changing a direction of a light beam emitted from the light emitting layer and for radiating the light beam passing through the transparent substrate.

4 Claims, 8 Drawing Sheets

ELECTROLUMINESCENT DISPLAY PANEL

BACKGROUND OF THE INVENTION

The present invention relates to a display panel having electroluminescent pixels, such as organic electroluminescent pixels.

There has been known an organic electroluminescent (EL) cell wherein fluorescent substance formed on a glass plate or a transparent organic film is applied with electric current to emit light. A plurality of EL cells are disposed as pixels to form an EL display panel.

Referring to FIGS. 9 and 10, a conventional EL display panel has a glass substrate 91 on which a plurality of strips of transparent electrodes 2 is disposed. On the transparent positive electrodes 2, a laminated organic thin layer 21, each layer of which is made of an organic compound, is formed. The organic layer 21 comprises a hole conduction layer 3 formed on the transparent electrodes 2, light emitting layer 4 formed on the hole transport layer 3, and an electron transport layer 5 on the light emitting layer 4. A plurality of metal negative electrodes 6 are disposed on the organic layer 21. The transparent positive electrodes 2 and the negative electrodes 6 are connected to an external power source 7.

The hole transport layer 3 serves to transmit holes from the transparent positive electrode 2 and to block electrons while the electrode transport layer 5 serves to transmit the electrons from the negative electrode 6. When an electron injected through the negative electrode 6 and a hole injected through the transparent positive electrode 2 are bound together, an exciton is generated. The exciton, during the quenching thereof, radiates light which is emitted out through the transparent positive electrode 2 and the glass substrate 91.

The transparent positive electrode 2 is made of such transparent conductive material as a indium-tin oxide (ITO) and other tin oxides having a large work function and capable of transmitting light to the ambience. For the negative electrode 6, aluminum, magnesium, indium, and silver, each having a small work function, are used singularly or as an alloy thereof, namely, aluminum-magnesium alloy and silver-magnesium alloy.

The material for the light emitting layer 4 is for example, 8-hydroxyquinoline-aluminum complex, and for the hole transport layer 3, N'-diphenyl-N, 1'-biphenyl-4, and 4'-diamine (TPD), for example, are preferable.

For the electron transport layer 5, an aluminum complex of 8-hydroxiyquinoline, for example, is used.

Each of the positive electrode and negative electrode layers and organic layers has a very small thickness in the order of several tens to several hundred nanometers. Hence the EL pixel is generally provided with the glass substrate 91 having a relatively large thickness in the order of millimeters as a support on which the layers are attached.

When producing the EL display panel, the transparent positive electrode 2 and the negative electrodes 6 are disposed to extend in perpendicular direction to each other as shown in FIG. 10, thereby forming a matrix. The pixel is formed at each juncture of the positive electrode 2 and the negative electrode 6.

In the above-described EL pixel, the light is radiated to the atmosphere from the luminescent layer 4 through the hole transport layer 3, transparent ITO positive electrode 2, and the glass substrate 91 in a wide range of zero to 180 degrees with respect to the light emitting surface of the light emitting layer 4. However, the light is refracted as the light passes through the boundary surface of each layer. If the refractive index of a material into which the light enters is larger than that of a material from which the light emerges, a light beam having an angle of incidence larger than the critical angle is totally reflected. That is, when an exit angle of emergence of a refracted wave is larger than 90 degrees, the incident light beam is totally reflected.

The relationship between the refractive indices at the boundary surface between two difference mediums is described. It is known from the Snell laws of refraction that when a refractive index $n_1$ of the emerging medium is larger than a refractive index $n_2$ of the incident medium, a critical angle e is expressed as follows.

$$\theta = \sin^{-1}(n_2/n_1)$$

For example, as shown in FIG. 11, when the light emitted from an emitting portion 31 is transmitted through the glass substrate 91 having the refractive index of 1.5 and out into the atmosphere having the refractive index of 1, the critical angle $\theta$ is calculated as, $$\theta = \sin^{-1}(1/1.5) = 41.8°$$

Hence, although some of the light beams emitted from the light emitting portions 31 are transmitted as shown by arrows $L_1$ and $L_2$, the light beams at the incident angle larger than 41.8 is reflected from a boundary surface S as shown by an arrow $L_3$. Thus the totally reflected light is blocked without being transmitted out into the atmosphere so that the quantity of transmitted light is decreased. As a result, the visually effective transmitting efficiency of the emitted light is decreased.

SUMMARY OF THE INVENTION

An object of the present invention is to provide a EL display where the transmitting efficiency is increased.

According to the present invention, there is provided an electroluminescent display panel comprising. a transparent substrate, a thin layer having a plurality of pixels and secured to a surface of the transparent substrate, a light emitting layer formed in each of the pixels of the thin layer, means for changing a direction of a light beam emitted from the light emitting layer and for radiating the light beam passing through the transparent substrate.

The means is provided for changing a light emitting angle of the light beam with respect to a surface of the light emitting layer, when the light emitting angle is larger than a critical angle at a boundary surface between the substrate and an atmosphere, so that an incident angle of the light beam to the boundary surface becomes smaller than the critical angle.

The means comprises a reflecting member for reflecting the light beam emitted from the light emitting layer.

The means is further composed by a transparent material the refraction index of which is different from that of the transparent substrate, whereby the light beam is refracted in the transparent material, thereby changing the incident angle.

Each of the light emitting layer has a rectangular shape, and a plurality of light emitting layers are arranged in matrix, interposing gaps there-between, the reflecting member has a wedge shape in section and is disposed at a position corresponding to each of the gaps.

These and other objects and features of the present invention will become more apparent from the following detailed description with reference to the accompanying drawings.

DETAILED DESCRIPTION OF THE PREFERRED EMBODIMENTS

Figure 9:
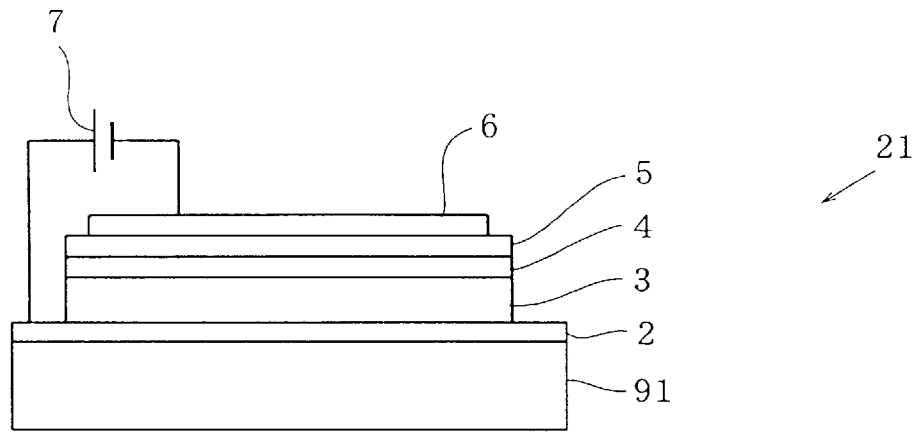
FIG. 9 is an elevational view showing an EL display panel.
Figure 10:
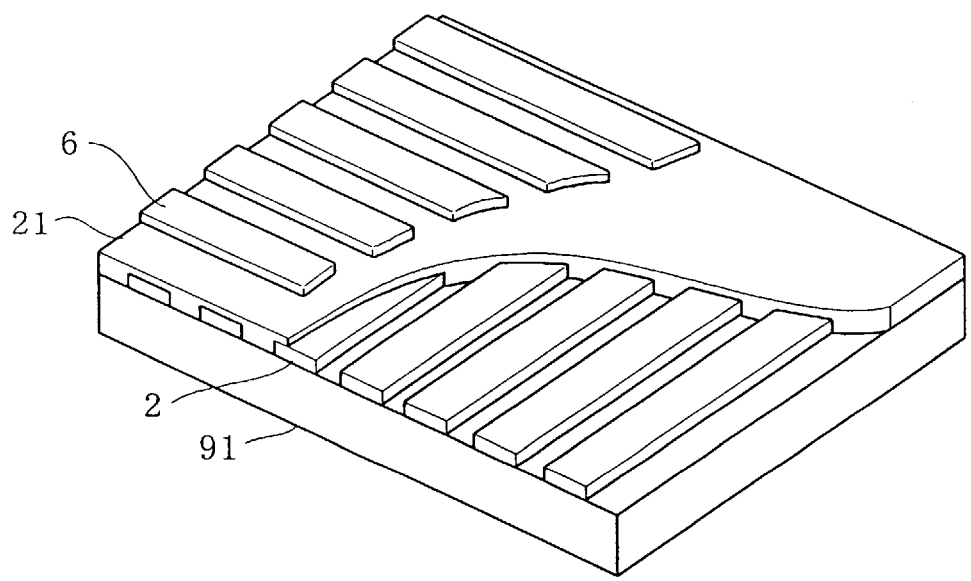
FIG. 10 is a partially cut-away perspective view of the conventional display panel.
Figure 11:
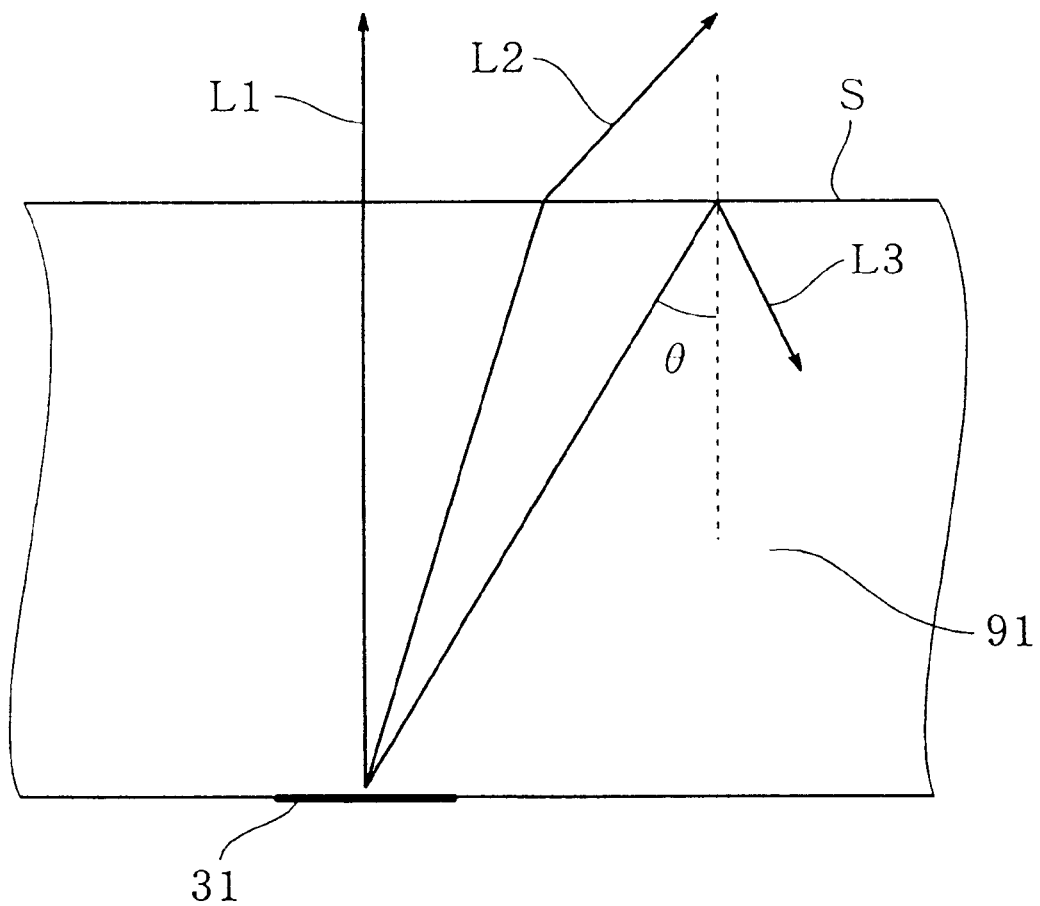
FIG. 11 is a diagram explaining the operation of an EL pixel in the conventional EL display panel.

An EL display panel of the present invention has a similar construction as the conventional display panel. The same reference numerals in FIG. 1 as those in FIGS. 9 and 10 designate the same parts in FIG. 1.

Figure 1:
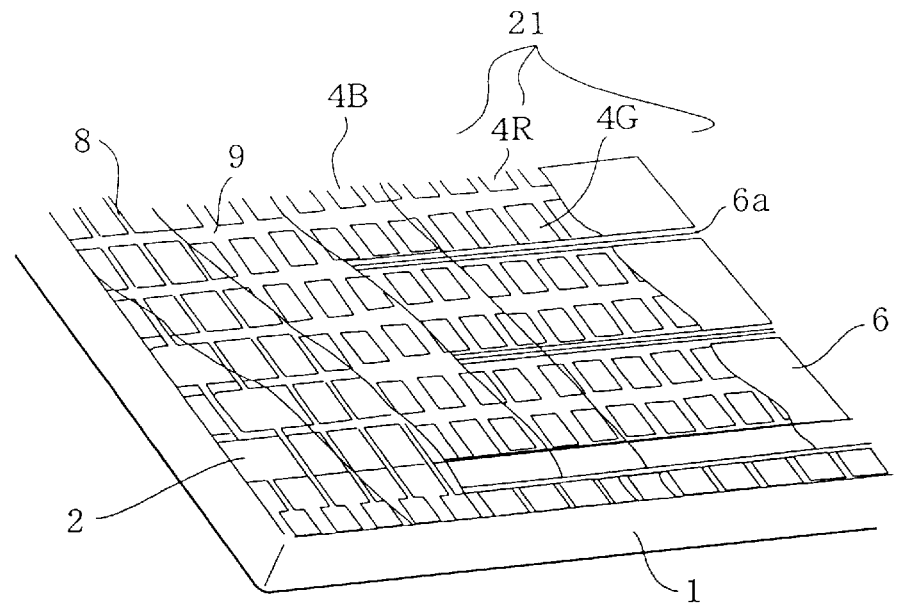
FIG. 1 is a partially cut-away view of an EL display panel according to the present invention.

Referring to FIG. 1, a layer of transparent ITO film is provided on a glass substrate 1, thereby forming transparent positive electrodes 2. Each positive electrode 2 comprises a pixel, separated from one another by gaps 14 (FIG. 4) formed in the electrode layer. A plurality of metal bus lines 8 are disposed in the gaps 14 in parallel to the strips of positive electrodes 2. The bus lines 8 connect the positive electrodes 2 with electrode connecting lines 13 (FIG. 4) to apply a light emission driving current.

The organic thin layer 21 is formed on the positive electrodes 2 and the bus lines 8, interposing an insulating film 9 for insulating the electrodes 2 from other layers. The organic layer 21 comprises the hole transport layer, luminescent layer, and electron transport layer as in the conventional EL display panel shown in FIG. 9. The luminescent layer comprises organic luminescent films 4R, 4G and 4B each disposed over one of the positive electrodes 2 for forming red, green and blue pixels, respectively. The negative electrodes 6 are disposed on the organic layer 21 to perpendicularly cross the electrode connecting lines 13. Each negative electrode 6 has a negative electrode partition 6a which is disposed in the gap 14.

Figure 2:
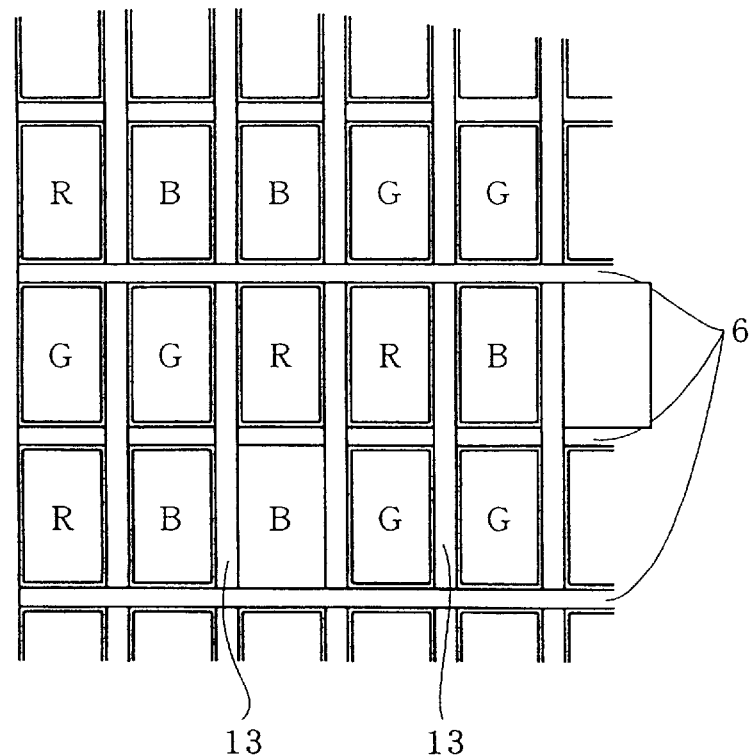
FIG. 2 is a plan view of a part of the display panel showing a matrix of organic EL pixels.

As shown in FIG. 2, the pixels are so arranged in a matrix that a pair of pixels of the same color, interposing the electrode connecting line 13 therebetween, are cyclically repeated in each row. The phase of each row of pixels is shifted from the adjacent row by a predetermined pitch. Each negative electrode 6 covers two rows of pixels. Hence, when one of the positive electrodes 2 and one of the negative electrodes 6 are driven, the pair of adjoining pixels of the same color can emit light.

Figure 3:
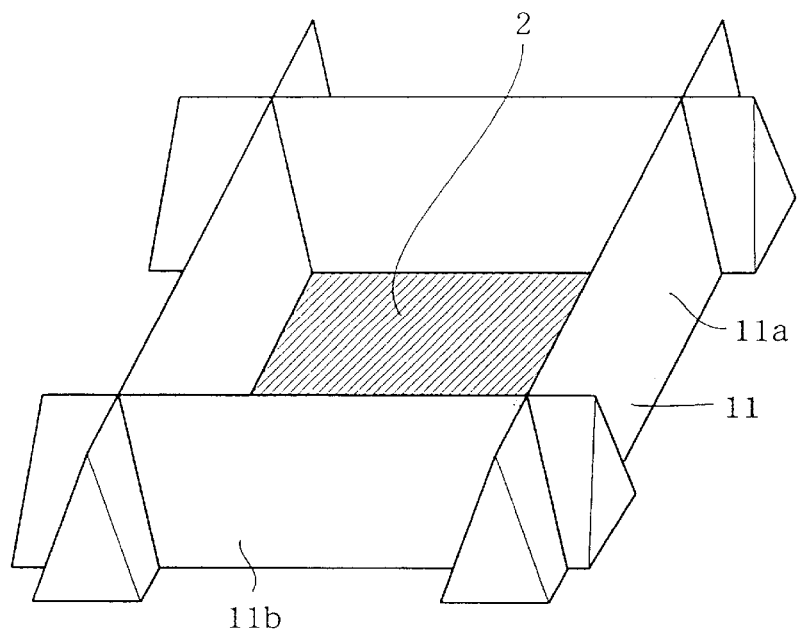
FIG. 3 is a perspective view of a wedged lattice provided in the display panel of the present invention.
Figure 4:
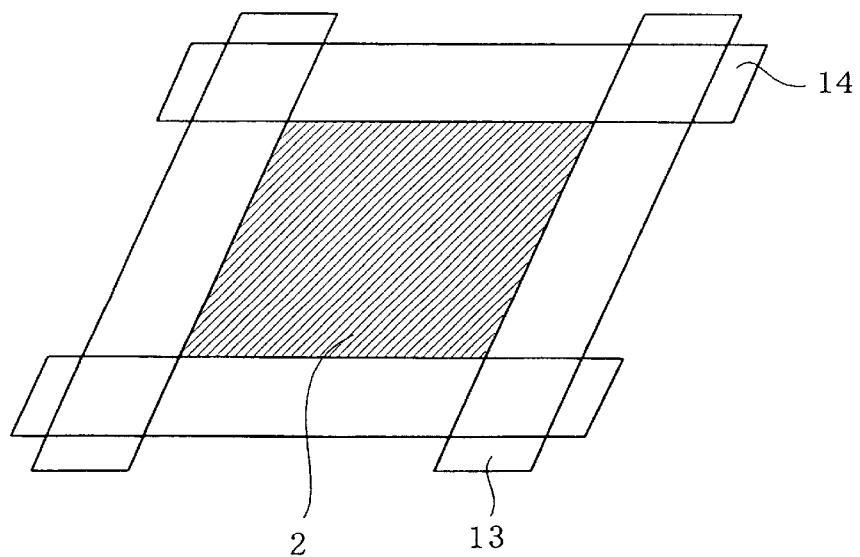
FIG. 4 is a perspective view of the organic EL pixel showing a surface thereof on which the wedged lattice of FIG. 3 is attached.

Referring to FIGS. 3 and 4, the pixels for the EL display panel according to the present invention is provided with a wedged metal lattice 11 embedded in a glass substrate 1 so that the incident angle of the light emitted from the organic luminescent films 4R, 4G, and 4B at the boundary surface between the glass substrate 1 and the atmosphere is smaller than the critical angle at the boundary surface between the glass substrate and the atmosphere. The wedged lattice comprises a plurality of longitudinal wedges 11a and lateral wedges 11b. As shown in FIG. 4, the positive electrode 2 opposing the surface of the glass substrate 1 is surrounded by the gaps 14 wherein the electrode connecting lines 13, bus lines 8 and the negative electrode partitions 6a are disposed. The positive electrode 2 is so formed on the glass substrate that each positive electrode 12 confronts an open space in the lattice 11 defined by the longitudinal and lateral wedges 11a and 11b, and each gap 14 opposes the wedge 11a or 11b. Namely, the longitudinal wedges 11a oppose the bus lines 8 and the lateral wedges 11b oppose the negative electrode partitions 6a.

Figure 5:
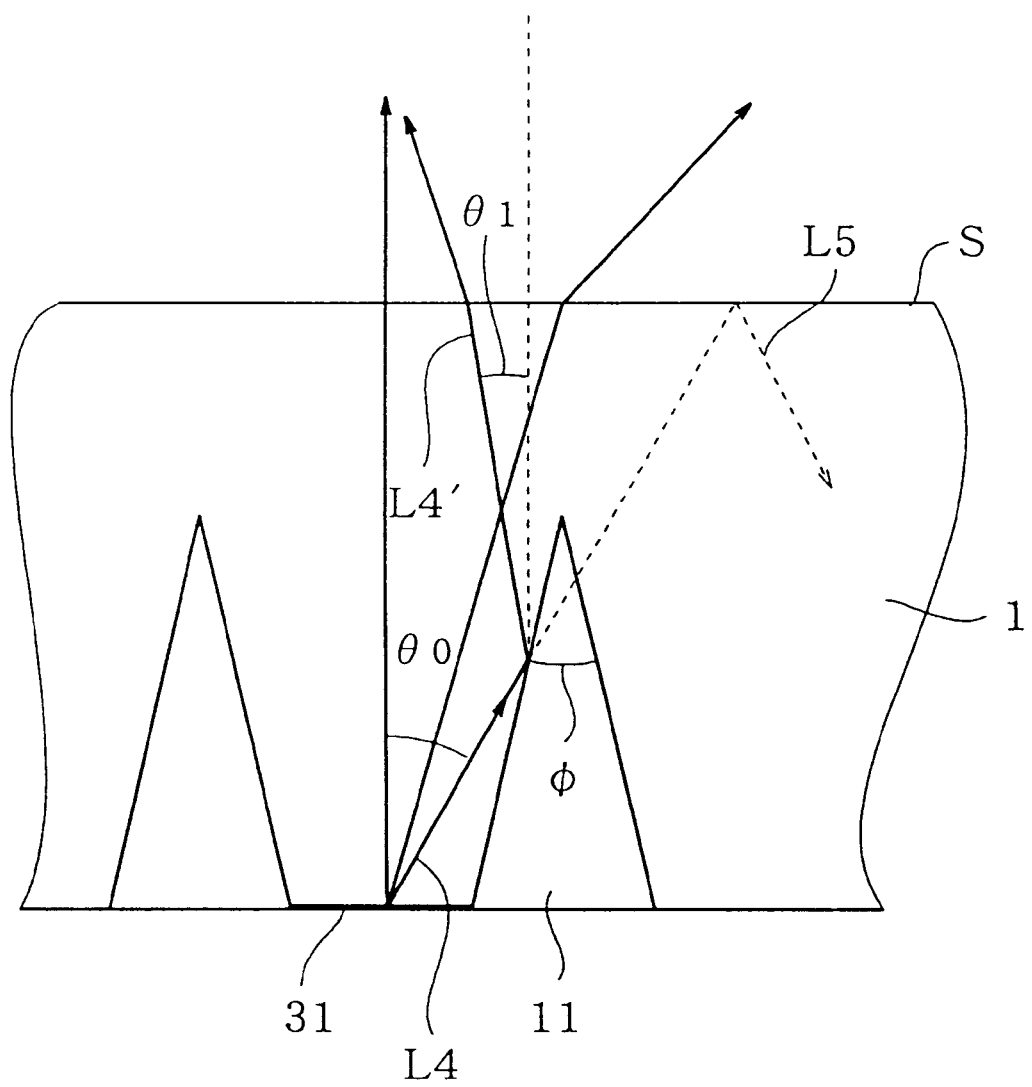
FIG. 5 is a diagram explaining the operation of the wedged lattice.

As shown in FIG. 3, each of the longitudinal wedges 11a and lateral wedge 11b has a section shaped of an isosceles triangle. The top edge of each wedge is directed toward the boundary surface between the glass substrate 1 and the atmosphere (FIG. 5).

The operation of the wedged lattice 11 is described hereinafter with reference to FIG. 5. Each of the longitudinal and lateral wedges 11a and 11b of the lattice 11 has a section having a vertical angle of $\phi$ degrees. The lattice 11 is so disposed that wedges surround the light emitting portion 31 of the organic luminescent film 4R, 4G or 4B of each pixel. Light is emitted through one point of the light emitting portion 31 at various angles as shown by arrows. A light beam $L_4$ emitted at an angle of $\theta_0$ degrees to a normal axis on the surface of the light emitting portion 31 is reflected by the wall of the lattice 11 and advances at an angle of $\theta_1$ degrees to another normal axis as shown by a line $L_4'$. Hence the angle of incidence at the boundary surface S between the glass substrate 1 and the atmosphere is $\theta_1$ degrees. As apparent from FIG. 5, $$\theta_1 + \phi/2 = \theta_0 - \phi/2$$

Thus, $$\theta_1 = \theta_0 - \phi$$

Accordingly, the incident angle ($\theta_1$ degrees) of the light beam entering the boundary surface S between the glass substrate 1 and the atmosphere can be reduced from $\theta_0$ degrees by $\phi$ degrees. Thus, the light emitted at substantially larger angle than the critical angle by $\phi$ degrees, which would reflect from the surface as shown by a dotted arrow $L_5$ without the wedge, can be emitted out into the atmosphere air.

Since the quantity of light is slightly reduced upon reflection at the lattice 11, it is preferable to let the light beams emitted from the emitting portion 31 at a smaller angle than the critical angle to directly reach the boundary surface S without reflection.

One method of producing the wedged lattice 11 is to cut out grooves of desired dimensions in the glass substrate 1 with a cutting tool. The groove is further shaped by etching. Thereafter, metal is deposited by vapor deposition to form the lattice 11, thereby forming reflection walls. The substrate 1 may be a substrate of plastic resin having grooves wherein metal is deposited.

Figure 6:
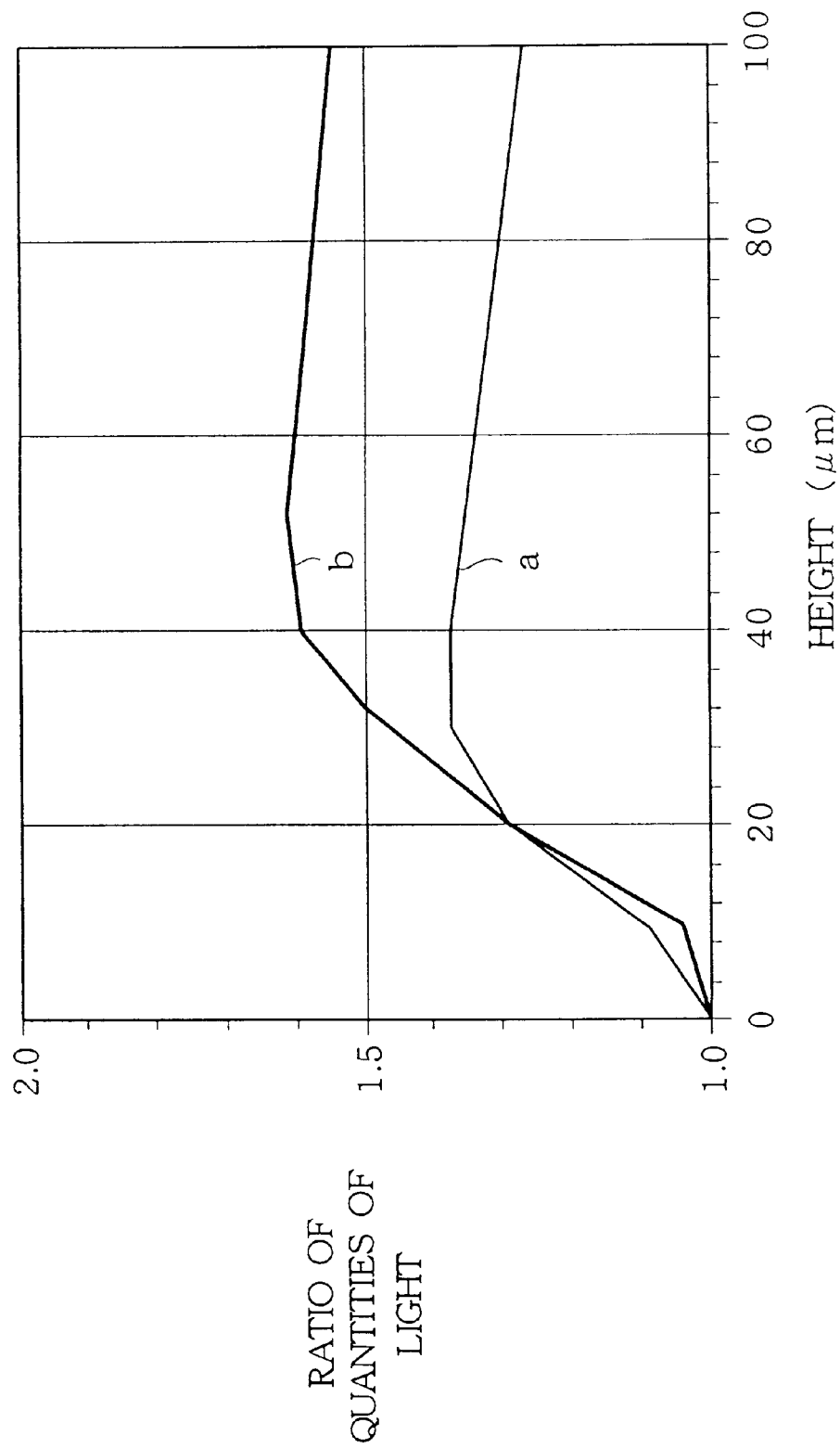
FIG. 6 is a graph showing a characteristic of transmitting light quantities of the EL pixel in accordance with the heights of the lattice.
Figure 7:
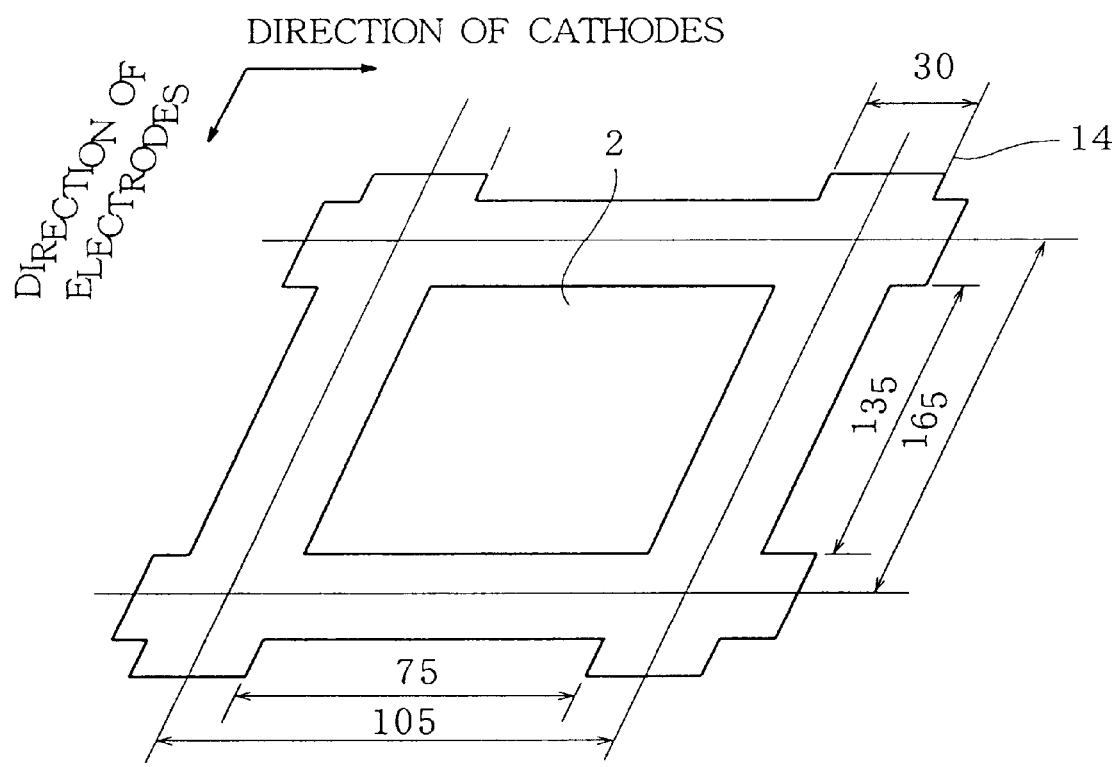
FIG. 7 is a diagram explaining the dimensions of an example of the lattice described in FIG. 6.

The height of the wedges 11a and 11b and the width of the base thereof is determined in accordance with various conditions such as the area and the shape of the light emitting portion 31. FIG. 6 shows simulations of the quantities of light in display panels having lattices of various dimensions. The ordinate of the graph indicates quantities of light shown as ratios of light quantities in the present invention to those in the conventional EL display panel without the lattice. A line a in FIG. 6 shows the characteristics of the quantity of light when the lattice is provided in the EL display panel having pixels as shown in FIG. 7. Namely, each pixel has the rectangular positive electrode 2 of 75 by 135 μm. The width of the gaps 14 formed between the positive 2, that is, the width of the base of each wedge of the lattice is 30 μm. The distances between the centers of the gaps 14 in the direction of the electrodes, that is the longitudinal direction of the panel, and in the direction of the negative electrodes, that is, the lateral direction is 165 and 105 μm, respectively. A line b shows the characteristic of quantity of light where the base of the wedges of the lattice 11 has a width of 20 μm.

As shown in FIG. 6, when the height of the wedges is 20 μm, a thirty percent increase in quantity of light is achieved in both cases shown by lines a and b. When the height is in the range between 30 μm and 100 μm, the quantity of light is much more increased when the width of the base is narrower, that is 20 μm, then when the width is 30 μm. and roughly, a fifty percent increase in the quantity of light can be expected.

The lattice 11 can be modified so as to have various other shapes. For example, the section of each wedges of the lattice may be a trapezoid, or the reflection surface thereof may be curved to form a concave or a convex. Since the visual characteristic of the EL display panel depends on the shape of the reflection surface, the shape of the wedges may be selected as appropriate to obtain the desired visual effect.

Figure 8:
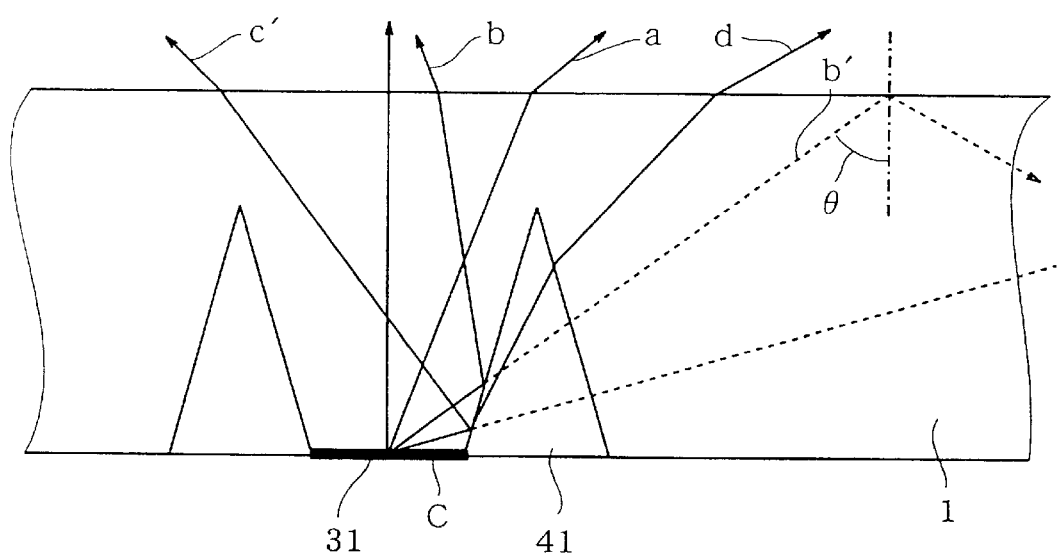
FIG. 8 is a diagram explaining the operation of a modification of the wedged lattice.

Referring to FIG. 8, in the second embodiment of the present invention, the EL display panel is provided with a wedged lattice 41 made of a transparent material having a smaller refraction index than that of the glass substrate 1. A light shown by an arrow a is transmitted through the glass substrate 1 and enters directly into the atmosphere. If the lattice 41 is not provided, a light beam shown by an arrow b is transmitted so that the incident angle at the boundary surface is e degrees as shown by a dotted line b'. Since the angle θ degrees is larger than the critical angle, the light beam b' is reflected from the boundary surface. However, in the EL pixel where the lattice 41 is embedded in the glass substrate 1, a light beam b is reflected from the surface of the lattice 41 and transmitted to the atmosphere.

A part of a light beam c is reflected from the lattice 41 in the similar manner as the light beam b as shown by an arrow c'. The remaining part of the light is refracted as it enters the lattice 41. The light beam d is further refracted as it emerges out of the lattice 41 and again when emerging out of the glass substrate 1 to enter the atmosphere. The degree of refraction depends on the refractive indices of the lattice 41 and the glass substrate 1, and the propagating direction of the light beam depends on the inclination of the boundary surface between the glass substrate 1 and the lattice 41.

The present invention may further be modified so that the lattice 11 or 41 has a conductive member at a part of the base of each wedge thereof, thereby obviating the bus lines 8. Namely, thin metal film is generally applied between the positive electrode 2 in a perpendicular direction to the negative electrodes 6 by vapor deposition, thereby to form the bus lines 8 as shown in FIG. 1. However, the bus lines 8 can be disposed between the positive electrodes 2 and the glass substrate 1 without deteriorating the operation and the performance thereof. Hence, by rendering a part of the base of each wedge conductive, or by forming a conductive film on the base surface, the bus lines 8 for the electrodes can be substituted.

The present invention may also be applied to other EL display panels such as those provided with inorganic EL pixels as long as the light emitted from a light emitting portion adhered on a transparent substrate is transmitted to the atmosphere passing through the substrate. The lattice may be made of materials other than metal and also formed in various shapes besides wedges.

In accordance with the present invention, an EL display panel is provided with means for changing the direction of the light beams. Accordingly, the light beams which would reflect from the boundary surface between the atmosphere and the transparent substrate are reflected from the changing means, thereby enabling to be transmitted through the substrate. Thus the transmitting efficiency of light is increased. By changing the reflection characteristics of the changing means, various visual effects are obtained from a single type of luminescent layer.

While the invention has been described in conjunction with preferred specific embodiment thereof, it will be understood that this description is intended to illustrate and not limit the scope of the invention, which is defined by the following claims.

What is claimed is:

1. An electroluminescent display panel comprising:

a transparent substrate;

a thin layer having a plurality of pixels and secured to a surface of the transparent substrate;

a light emitting layer formed in each of the pixels of the thin layer;

a plurality of reflecting members provided in the transparent substrate for changing a direction of a light beam emitted from the light emitting layer and for radiating the light beam passing through the transparent substrate, wherein each light emitting layer has a rectangular shape, and a plurality of light emitting layers are arranged in a matrix, interposing gaps therebetween, each reflecting member has a wedge shape in section and is disposed at a position corresponding to each of the gaps and a tip of the wedge shape is positioned toward an atmosphere side of the substrate.

2. The electroluminescent display panel according to claim 1, wherein each of the reflecting members is provided for changing a light emitting angle of the light beam with respect to a surface of the light emitting layer, when the light emitting angle is larger than a critical angle at a boundary surface between the substrate and an atmosphere, so that an incident angle of the light beam to the boundary surface becomes smaller than the critical angle.

3. The electroluminescent display panel according to claim 2, wherein each of the reflecting members is composed by a transparent material, a refraction index of which is different from that of the transparent substrate, whereby the light beam is refracted in the transparent material, thereby changing the incident angle.

4. The electroluminescent display panel according to claim 1 wherein the light emitting layer comprises an organic compound.

* * * * *